US005592510A

United States Patent [19]
Van Brunt et al.

[11] Patent Number: 5,592,510
[45] Date of Patent: Jan. 7, 1997

[54] COMMON MODE EARLY VOLTAGE COMPENSATION SUBCIRCUIT FOR CURRENT DRIVER

[75] Inventors: Roger W. Van Brunt, San Francisco; Florin A. Oprescu, Sunnyvale, both of Calif.

[73] Assignee: Apple Computer, Inc., Cupertino, Calif.

[21] Appl. No.: 219,664

[22] Filed: Mar. 29, 1994

[51] Int. Cl.$^6$ ................................. H04B 1/38; H04L 5/16
[52] U.S. Cl. ..................... 375/220; 375/257; 326/86; 326/91
[58] Field of Search ..................... 375/257, 219, 375/220; 326/62, 82, 86, 89, 90, 91

[56] References Cited

U.S. PATENT DOCUMENTS

| | | | |
|---|---|---|---|
| 4,507,793 | 3/1985 | Adams | 375/257 |
| 4,760,282 | 7/1988 | Kuo et al. | 326/90 |
| 5,408,497 | 4/1995 | Baumann et al. | 375/257 |

FOREIGN PATENT DOCUMENTS

| | | |
|---|---|---|
| 0303407 | 2/1989 | European Pat. Off. . |
| 0568197 | 11/1993 | European Pat. Off. . |
| 21824 | 7/1982 | Germany . |

*Primary Examiner*—Stephen Chin
*Assistant Examiner*—Don Vo
*Attorney, Agent, or Firm*—Blakely, Sokoloff, Taylor & Zafman

[57] ABSTRACT

In a driver circuit for a twisted pair cable, a compensator for preventing appreciable common mode current flow into or out of the twisted pair cable in response to the device receiving a wide range of common mode voltage bias levels. A wide range of external bias voltages may be received as a result of variations in the ground node voltages of two coupled devices. The compensator circuit utilizes a feed back loop and monitors the bias voltage received on the twisted pair cable. As the magnitude of the common mode current increases due to external bias voltage variation from a reference bias voltage, the current flow of p-channel transistors, coupled in an arrangement of the present invention, is increased (or decreased, as necessary) so that reduced common mode current flows onto the twisted pair cable. The present invention reduces appreciable common mode current flow through the twisted pair cable from the driver that are due to variations in the external bias voltage between communication devices. The present invention provides high common mode output impedance for the driver circuit by altering the effective common mode common mode early voltage characteristics of the driver circuit while utilizing shorter channel length transistors for high speed communication capacity. The present invention also offers reduced current supply capacity of the common mode bias voltage source. The present invention operates ideally within driver circuits compatible with the IEEE P1394 communication standard.

35 Claims, 12 Drawing Sheets

$$V_{TP} = -2mA\,(2R_T) = 4mA\,R_T$$
$$V_{CM} = V_{TPBIAS} - (7mA\,\frac{R_T}{2})$$

5,592,510

COMMON MODE EARLY VOLTAGE COMPENSATION SUBCIRCUIT FOR CURRENT DRIVER

BACKGROUND OF THE INVENTION (1) Field of the Invention

The present invention relates to the field of data communications. More particularly the present invention relates to the field of efficient signal transmissions over high speed communication links.

(2) Prior Art

Small differential signals provide a number of advantages for the transmission of high bit rate data signals. A differential channel provides rejection of common mode noise (such as power supply noise) that may be present between a transmitting ("driving") and a receiving node. Differential signals can be transmitted on well known twisted-pair cables which are less expensive than coaxial or fiber optic cables and which when shielded, offer very good rejection of interferences from sources of external noise. Using small signal level differential signals over a shielded twisted-pair cable reduces EMI emissions, simplifies transmitter design, and reduces power dissipation.

One characteristic of a differential communication channel is that it reduces timing distortion due to mismatched rise and fall times and receiver threshold. Timing distortion must be minimized since in a digital communication system data is encoded in both time and amplitude. It is very difficult in a single-ended communication system to match the rise and fall times and this mismatch becomes significant when data rates become high (e.g., 50 Mbaud or more). Differential systems, however, do not suffer duty cycle distortion due to rise and fall time mismatch. Also, within a differential receiver, the threshold is not set externally as in a single-ended system. Instead, the threshold in a differential system is a function of the received signal and therefore tracks with the received signal corresponding to when the differential signal equals zero volts. As such, it would be advantageous to provide high speed communication using a differential signal configuration.

Twisted pair drivers may utilize a bias voltage applied between terminating resistors of a twisted pair cable. For a given twisted pair cable, the bias voltage of the driver circuit that couples two devices is in some instances generated by a single device. As such, with respect to a single twisted pair cable, two circuits may utilize or share the bias voltage generated by one of the devices. Therefore, depending on the coupled device to an overall communication network, the bias voltage may vary somewhat from device to device. For instance, an exemplary bias voltage generated by one device (ideal) may be 1.8 volts, but the voltage received by the other device may range widely from 1.0 volt to 2.8 volts for a typical range of devices coupled to a communication network. It would be advantageous to provide a communication apparatus that operates within this wide range of bias voltages and the present invention provides such functionality.

A wide received bias voltage (common mode voltage) range may also occur if one device has a lower or higher ground node than another coupled device. In this case the bias voltage perceived by one device may be slightly higher or lower than the bias voltage generated by the other device (e.g., by about +0.5 to 1 volt). If one device receives a high or low external bias voltage because of the variations in ground node voltages, then this will typically cause an imbalance in the driver circuit and communication errors may occur.

The wide common mode voltage range as described above, depending on the driver circuit design, may cause common mode current flow into or out of the twisted pair driver. This is unwanted since the additional current supplied by the driver may be detected as a common mode signal across the twisted pair cable and this type of common mode signal may decrease the margin for speed signaling detection which utilizes a particular signal characteristic under the IEEE P1394 communication standard. An undesirable event may occur wherein the common mode current from the driver may appear improperly as a recognized common mode speed signal under the above IEEE standard and may be improperly perceived as proper speed information. As such, it is advantageous to provide a driver circuit that does not generate common mode current signals as a result of a wide common mode voltage range arrangements between coupled devices. The present invention offers such advantageous functionality.

One solution to the problem of unwanted common mode current flow resulting from above variations in the common mode bias voltage is to utilize p-type and n-type transistors having larger channel lengths to act as the driving transistors over the twisted pair cable. By increasing the channel length dimensions the transistors will have increased output impedance. This larger output impedance tends to reduce unwanted common mode current over the twisted pair cable. However, it is not advantageous to utilize larger p-channel transistors because larger channel length transistors are slow and decrease the overall communication rate of the driver and also increase the die size required of the integrated circuit on which the drivers are implemented. It is advantageous, for high speed communication, to use relatively small channel length transistors. The present invention provides a driver circuit that does not allow significant common mode current in response to wide common mode bias voltage range as described above yet utilizes relatively small channel length transistors.

Accordingly, it is an object of the present invention to provide efficient communication between coupled devices. It is another object of the present invention to provide a twisted pair driver circuit that does not generate significant common mode current in response to a wide common mode range. It is further an object of the present invention to provide a driver circuit that restricts improper common mode current flow when devices having different ground node voltages (e.g., ground drops) are coupled together. It is an object of the present invention to provide a driver circuit that may be compatible with a variety of communication devices having a wide range of bias voltages. It is yet another object of the present invention to provide a driver circuit that may operate with a common mode bias voltage source having a reduced current supply capacity. These and other objects not specifically mentioned above will become clear within discussions of the present invention to follow.

SUMMARY OF THE INVENTION

In a driver circuit for a twisted pair cable, a compensator for preventing appreciable common mode current flow into or out of the twisted pair cable in response to the device receiving a wide range of common mode voltage bias levels is described. A wide range of external bias voltages may be received as a result of variations in the ground node voltages of two coupled devices. The compensator circuit utilizes a feed back loop and monitors the bias voltage received on the twisted pair cable. As the magnitude of common mode current increases due to external bias voltage variation from a reference bias voltage, the current flow of p-channel transistors, coupled in an arrangement of the present invention, is increased (or decreased, as necessary) so that reduced common mode current flows onto the twisted pair cable. The present invention reduces appreciable common mode current flow through the twisted pair cable from the driver that are due to variations in the external bias voltage between communication devices. The present invention provides high common mode output impedance for the driver circuit by altering the effective common mode early voltage characteristics of the driver circuit while utilizing shorter channel length transistors for high speed communication capacity. The present invention also offers reduced current supply capacity of the common mode bias voltage source. The present invention operates ideally within driver circuits compatible with the IEEE P1394 communication standard.

More specifically, embodiments of the present invention include a driver circuit including: driving circuitry for driving differential signals over a twisted pair cable and for driving common mode current speed signals over the twisted pair cable, the driving circuitry comprising driving transistors and having a common mode bias voltage; and a subcircuit for increasing the effective common mode early voltage characteristic of the driving transistors in response to variations in the bias voltage from a reference voltage level, the subcircuit effectively reducing common mode current flow over the twisted pair cable in response to variations in the bias voltage from the reference voltage level.

Further embodiments of the present invention include a driver circuit as described above wherein the subcircuit is for increasing the effective common mode output impedance of the transistors of the driving circuitry and wherein the common mode current signals over the twisted pair cable are for conveying speed signal information. Embodiments of the present invention include the above and wherein the subcircuit comprises two amplifiers coupled in a feed back arrangement and wherein the driving transistors of the driving circuitry are current drivers. The present invention includes the above and wherein the driving transistors of the driving circuitry are small channel length transistors.

The present invention also includes a communication network implemented with the common mode early voltage correction subcircuit of the present invention as well as a method implemented consistent with the present invention subcircuit.

DETAILED DESCRIPTION OF THE INVENTION

Figure 1:
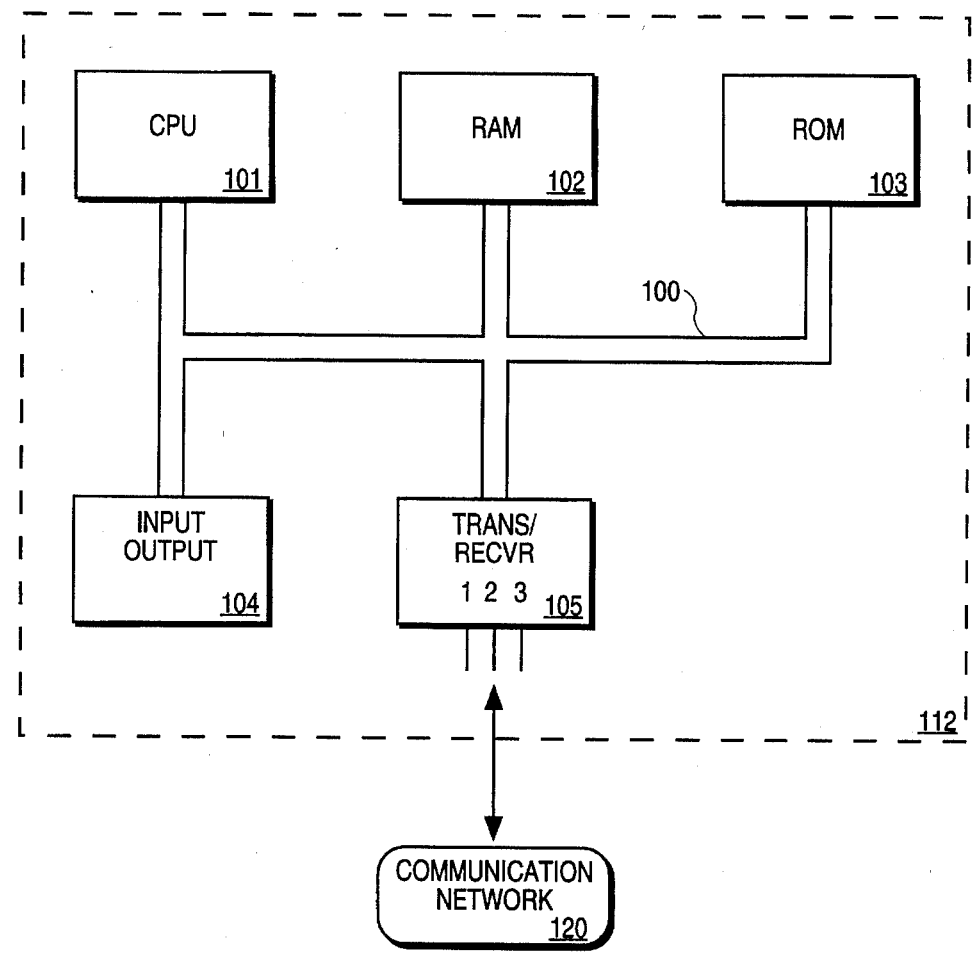
FIG. 1 illustrates a computer system of the present invention utilizing the transmitter of the present invention.

In the following detailed description of the present invention, numerous specific details are set forth in order to provide a thorough understanding of the present invention. However, it will be obvious to one skilled in the art that the present invention may be practiced without these specific details. In other instances well known methods, procedures, components, and circuits have not been described in detail as not to unnecessarily obscure aspects of the present invention.

OVERVIEW

The preferred embodiment of the present invention is a compensation subcircuit that is utilized by a driver circuit of the present invention. To this extent the early voltage correction subcircuit of the present invention is a companion circuit to the driver of the present invention. The current driver circuit is for driving differential and common mode signals over a twisted pair cable coupling two communication devices. The driver is a single circuit current driver compatible with the IEEE P1394 communication standard. The preferred embodiment of the present invention is an effective early voltage correction subcircuit that is used by the driver circuit to insure that no appreciable common mode current is sourced or sunk from the twisted pair cable in response to variations of an externally supplied common mode bias voltage from an optimum bias voltage level. The bias voltage source is typically supplied on the other end of the cable from the driver.

A wide common mode bias voltage range, as received by the driver circuit of the present invention may result due to variations in the ground node voltages of two coupled devices. As a result of a less than ideal network configuration, a bias voltage that deviates from the expected or optimum bias voltage is supplied over the twisted pair cable to the driver of the present invention. In these cases, the present invention subcircuit restricts improper common mode current flow from the driver into the twisted pair cable.

Using the common mode early voltage correction circuitry of the present invention, devices having a wide range of ground node voltages may be coupled together within a common communication network without an appreciable amount of improper common mode current flowing from the driver circuitry into the twisted pair cable. Common mode current flow over the twisted pair cable appears as speed signal information by the receiver of the present invention and therefore a variant bias voltage may improperly transmit speed signal information or reduce signal margins in speed signal detection. The present invention reduces the chances of the above from happening.

In addition to the present invention common mode early voltage correction subcircuit, the driver circuit and its operational environment are discussed. The common mode early voltage subcircuit of the preferred embodiment of the present invention is discussed in further detail below. The driver circuit of the present invention is discussed first.

The driver includes a transmission circuit for transmitting data (and arbitration information) over a twisted pair cable using differential signals and simultaneously transmitting communication rate information ("speed signal") over the twisted pair cable using a common mode voltage variation. The present invention driver allows a communication unit to communicate or signal its use of a high speed communication rate ("speed signal") to another communication unit without requiring additional communication throughput because the common mode signal and the differential signal may be transmitted over the twisted pair cable simultaneously. This is very effective within high performance high speed communication networks. The present invention driver operates within a communication network within which various units of varying capability and versions may be attached. Units may effectively communicate a speed signal using common mode signaling while simultaneously communicating data (or arbitration signals) using differential signals. The speed signal may be used in advance of communicating at a high data transfer rate depending on the particular communication protocol adopted by the network employing the present invention driver. The present invention driver employs a single circuit for transmitting the differential signals and for transmitting the common mode speed signal so that two separate transmitter circuits are not required. In this fashion, a single driver circuit may be utilized consistent with the IEEE P1394 standard.

In addition to the discussions herein regarding differential signal transmissions, a related copending application entitled CMOS Differential Twisted-Pair Driver, Ser. No. 08/100,662, filed Jul. 30, 1993, and assigned to the assignee of the present invention, describes circuitry for transmitting differential signals over a twisted pair cable but does not employ speed signaling using the common mode voltage. Another copending application entitled Method and Apparatus for a Dynamic, Multi-Speed Bus Architecture in which an Exchange of Speed Messages Occurs, Ser. No. 08/033,119, filed Mar. 18, 1993, and assigned to the assignee of the present invention, describes a protocol that can be used by the present invention single circuit driver for utilizing the speed signaling of the present invention for communicating data transfer rate information among connected communication units. This may be used at initialization or during routine communication after system start up depending on the protocol adopted. One aspect of the present invention is drawn to the circuitry and related method used by a communication unit for generating the speed signal and the differential signals on a single driver circuit having an effective common mode early voltage correction subcircuit.

COMPUTER SYSTEM

Refer to FIG. 1 which illustrates an exemplary computer system 112 that may be used in accordance with the present invention driver circuit. A central processor 101 is coupled to an address/data bus 100. The central processor 101 executes instructions stored in memory and processes data. A random access memory (RAM) 102 is coupled to the bus 100. The RAM 102 is for storing data and instructions. A read only memory (ROM) 103 is static memory storage and is also coupled to bus 100. An input/output device 104 is coupled to the address/data bus 100 for receiving and transmitting user information. The device 104 may include a keyboard, mouse, display unit, printer, modem, serial port, stylus and tablet, microphone, analog to digital converter, digital to analog converter, or other hardcopy or graphic display device.

Also coupled to the address/data bus 100 (or similarly coupled to receive system data) is a transmitter/receiver device 105 that contains the driver of the present invention and contains three pairs of twisted cable (illustrated as 1, 2, 3) as well as other linking circuitry. Device 105 contains link circuitry including a media access controller IC (MAC) which is a digital protocol IC for interfacing the driver of the present invention to bus 100. The MAC circuitry is not particularly pertinent to aspects of the present invention as developed herein. The transmitter/receiver device 105 allows the system 112 to transmit and receive information and high data transfer rates. For example, information may be processed by unit 105 at 100, 200, or 400 Megabits per second. Up to three different twisted pairs may be coupled to the transceiver 105 according to the present invention. A cable contains three twisted pairs, two for communication and one for power. However, it is appreciated that alternative embodiments of the present invention may utilize more than three ports or fewer than three ports as appropriate. The transceiver 105 is coupled to a communication network 120 that is composed of other devices (in addition to the computer system 112) and an exemplary network is described to follow. The computer system 112 may be implemented on a single chassis or within a single computer chip and as such is not limited to a desktop computer system. For instance, the computer system 112 may be implemented within a PDA or similar device.

COMMUNICATION NETWORK

Figure 2:
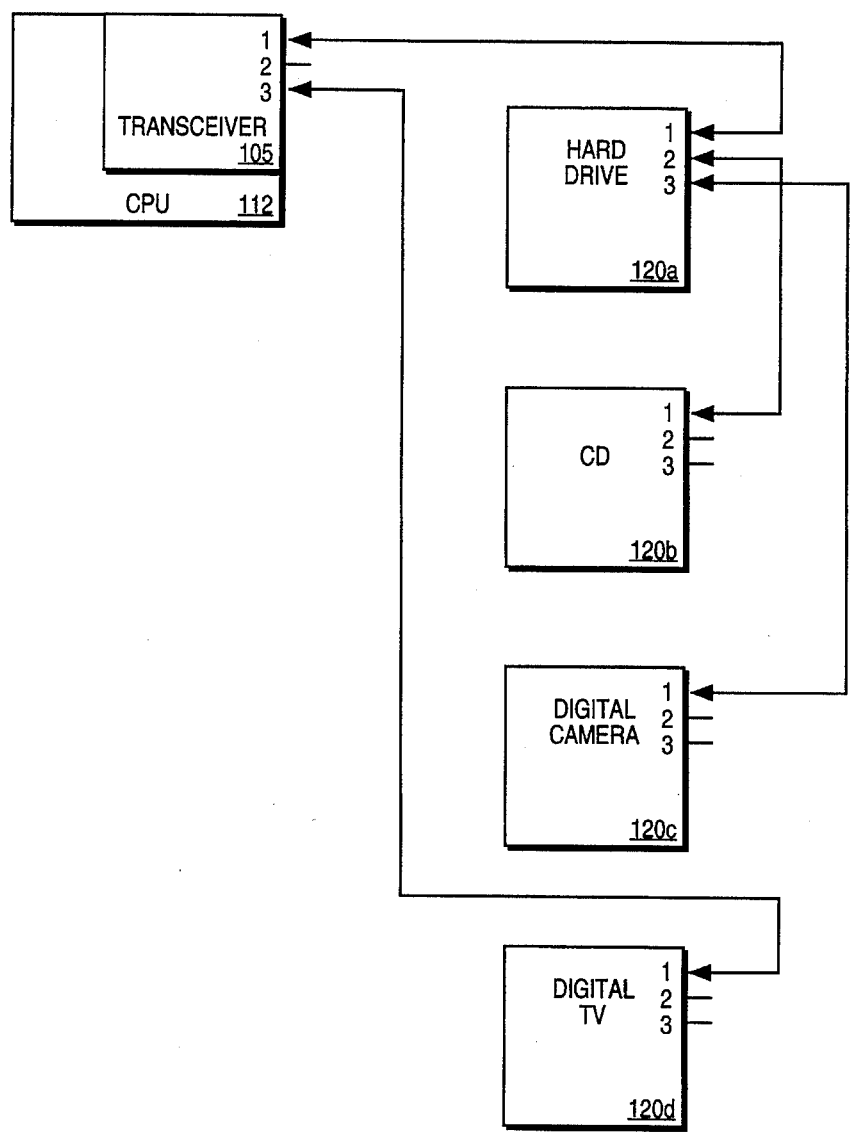
FIG. 2 illustrates an exemplary communication network of the present invention.

FIG. 2 illustrates the computer system 112 integrated within an exemplary communication network. It is appreciated that the overall system 125 may be implemented for processing digital audio and graphic information in real-time given the high speed data transmissions provided by the present invention transceiver 105. Given this, the system 125 may be implemented for supporting a number of multimedia applications, as well as other general purpose computing applications. Each device (120a–120d) of the network comprises three ports for coupling with other communication devices in a variety of methods and is not limited to a "daisy chain" configuration nor limited to a "star" configuration. Any device coupled to the network may communicate with any other device so coupled. It is appreciated that each device within the exemplary network contains a separate transceiver unit 105 as employed by the computer system 112. This transceiver unit of the present invention is discussed in further detail below. As shown, the exemplary network is composed of the computer system 112 coupled, via transceiver 105 to one twisted pair port (1) of a hard drive peripheral system 120a.

The second twisted pair port of the hard drive system 120a is coupled to one twisted pair port of a digital compact disc (CD) peripheral system 120b for audio information. A third twisted pair port of the hard drive system 120a is coupled to a first twisted pair port of a digital television peripheral system 120d for digital graphic display of information in real-time. Also coupled to the computer system 112 via a twisted pair cable is a digital camera system 120c for capturing digital graphic images in real-time and supplying same to the system 125. It is appreciated that a microphone unit may also be coupled to the system 125 for supplying digitized audio information. The above system 125 is exemplary only in that other devices not shown may be adapted to operate with the driver circuit of the present invention and other devices illustrated may be omitted. The devices illustrated within system 125 provide a platform for many multimedia applications and generally for the processing and manipulation of graphic and or audio information with a computer system environment. Using the communication network, devices may communicate information at exemplary rates of 100, 200 or 400 Megabits per second, depending on the capability of the attached device.

DIFFERENTIAL AND COMMON MODE SIGNAL DRIVER CIRCUIT

Figure 3:
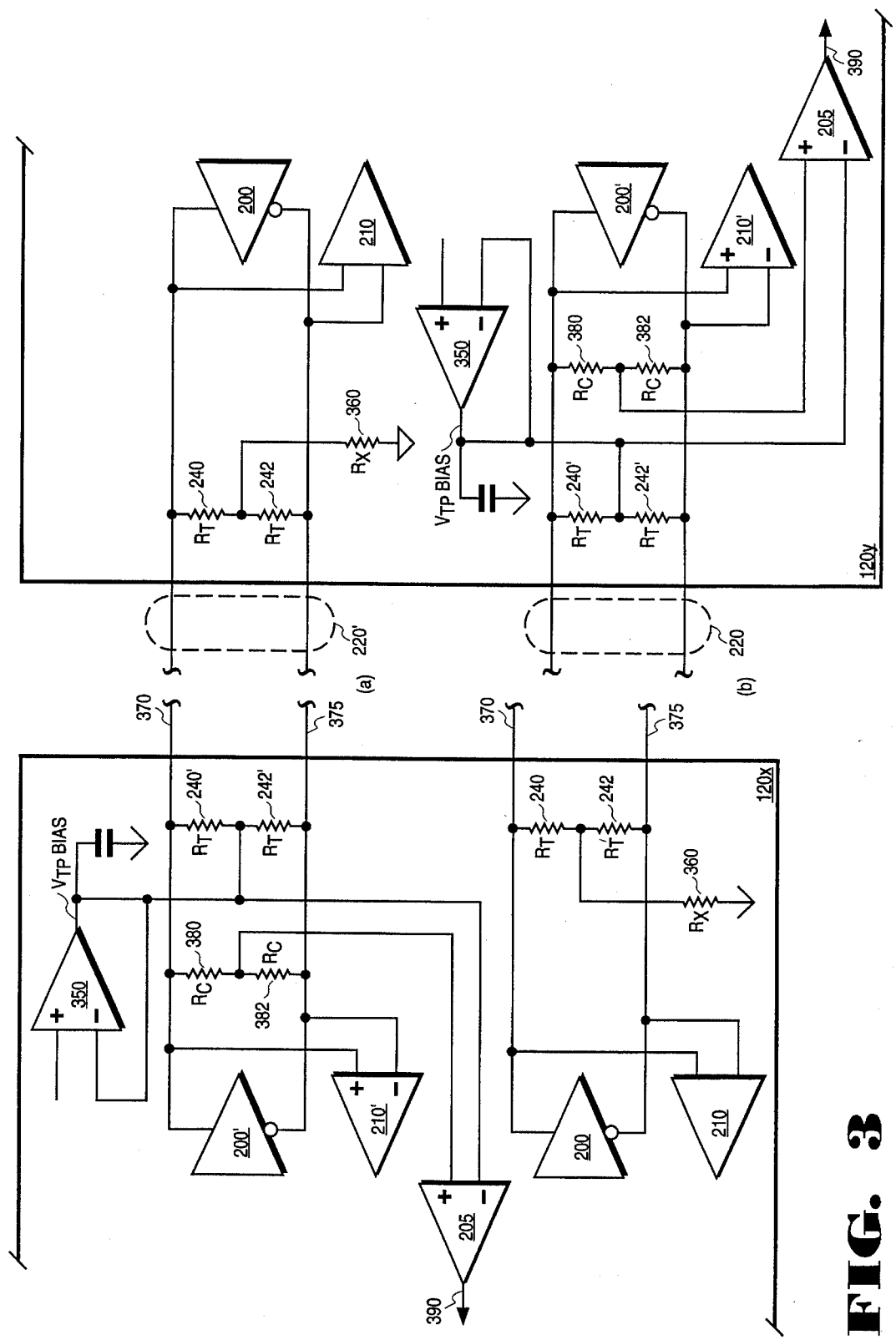
FIG. 3 is a circuit illustration of the circuitry of a typical port of the present invention illustrating the transmitter/receiver pair coupling with the twisted pair cables that comprise the port.

FIG. 3 illustrates the circuitry of a single port and two twisted pairs implemented with the driver circuit 200 of the present invention. A single port contains two twisted pairs 220' and 220 in the configuration as shown. As discussed above, each communication unit (e.g., device, peripheral, etc.) may contain a separate transceiver. In one embodiment, each transceiver of the present invention contains circuitry for communicating over three separate ports. FIG. 3 illustrates the circuitry for one port and two twisted pairs. However, it is appreciated that within the discussions hereinafter, the circuitry of FIG. 3 is replicated within each device to provide for communication handling over each separate port of the three possible ports of a given device.

A given port contains circuitry for transmitting a speed signal and circuitry for receiving the speed signal from a coupled device. FIG. 3 illustrates communication circuitry shown as (a) for coupling device 120x to device 120y using twisted pair cable 220' and also illustrates communication circuitry (b) for coupling device 120x to device 120y using twisted pair cable 220. Speed signal information is transmitted from device 120x and detected by device 120y using circuitry (b) and twisted pair cable 220. Speed signal information is transmitted from device 120y and detected by device 120x using circuitry (a) and twisted pair cable 220'. Port circuitry (a) and port circuitry (b) are mirror images of each other and therefore discussions of the present invention will focus on one circuit implementation (e.g., circuitry (b)). It is appreciated that discussions regarding circuitry (b) are equally applicable to circuitry (a).

As shown in FIG. 3, circuit (b), associated with one twisted pair cable of an exemplary network communication device 120x, there is a transmitter (driver) 200 of the present invention and a receiver 210. The transmitter 200 is coupled to a twisted pair cable 220 that is composed of a first wire 370 and a second wire 375. The cable 220, as shown in FIG. 3, is coupled to another exemplary communication device 120y. Device 120y similarly contains a receiver 210' and a transmitter 200' of the present invention. Transmitter 200' is of the present invention with speed signal mode disabled. Coupled across lines 370 and 375 are two terminating resistors (Rt) 240 and 242 associated with device 120x and also two other terminating resistors (Rt) 240' and 242' of device 120y. These resistors 240 and 242 are coupled in series across the twisted cable 220. A bias voltage VtpBias, is applied, as shown, by a voltage supply 350 between resistors 240' and 242' of device 120y. The bias voltage 350 is applied at one end of the communication link for a given port circuit. In one embodiment, the optimum bias voltage is 1.8 volts and the value of each terminating resistor is 55 ohms. However, it is appreciated that other voltage and resistor values may be utilized within the scope of the present invention.

Also coupled to one end of communication link (b) is a common mode voltage detection circuit 205 coupled in between two resistors (Rc) which are each 1 k ohms. The circuitry 205 also receives the bias voltage (VtpBias) as a reference. The receiver 210 (and 210') and transmitter 200 (and 200') of the present invention of each device are coupled in parallel to the twisted pair cable 220 as shown in FIG. 3. As is discussed in further detail below, the single circuit transmitters 200 and 200' of the present invention are capable of transmitting differential signals over cable 220 and also capable of transmitting common mode voltage signals over cable 220. Differential voltage signals are measured across lines 370 and 375.

In operation during arbitration, when device 120x is to transmit speed signal information to device 120y, then port circuitry (b) is utilized. This communication link is biased by the supply 350 of device 120y and the speed signal information is driven by driver 200 of the present invention located in device 120x. The common mode voltage variation resultant from the speed signal assertion is detected by detector 205 of device 120y. When device 120y is to transmit speed signal information to device 120x the reverse is true. Port circuitry (a) is utilized and this communication link is biased by the supply 350 of device 120x and the speed signal information is driven by driver 200 of the present invention located in device 120y. The common mode voltage variation resultant from the speed signal assertion is detected by detector 205 of device 120x.

Figure 4:
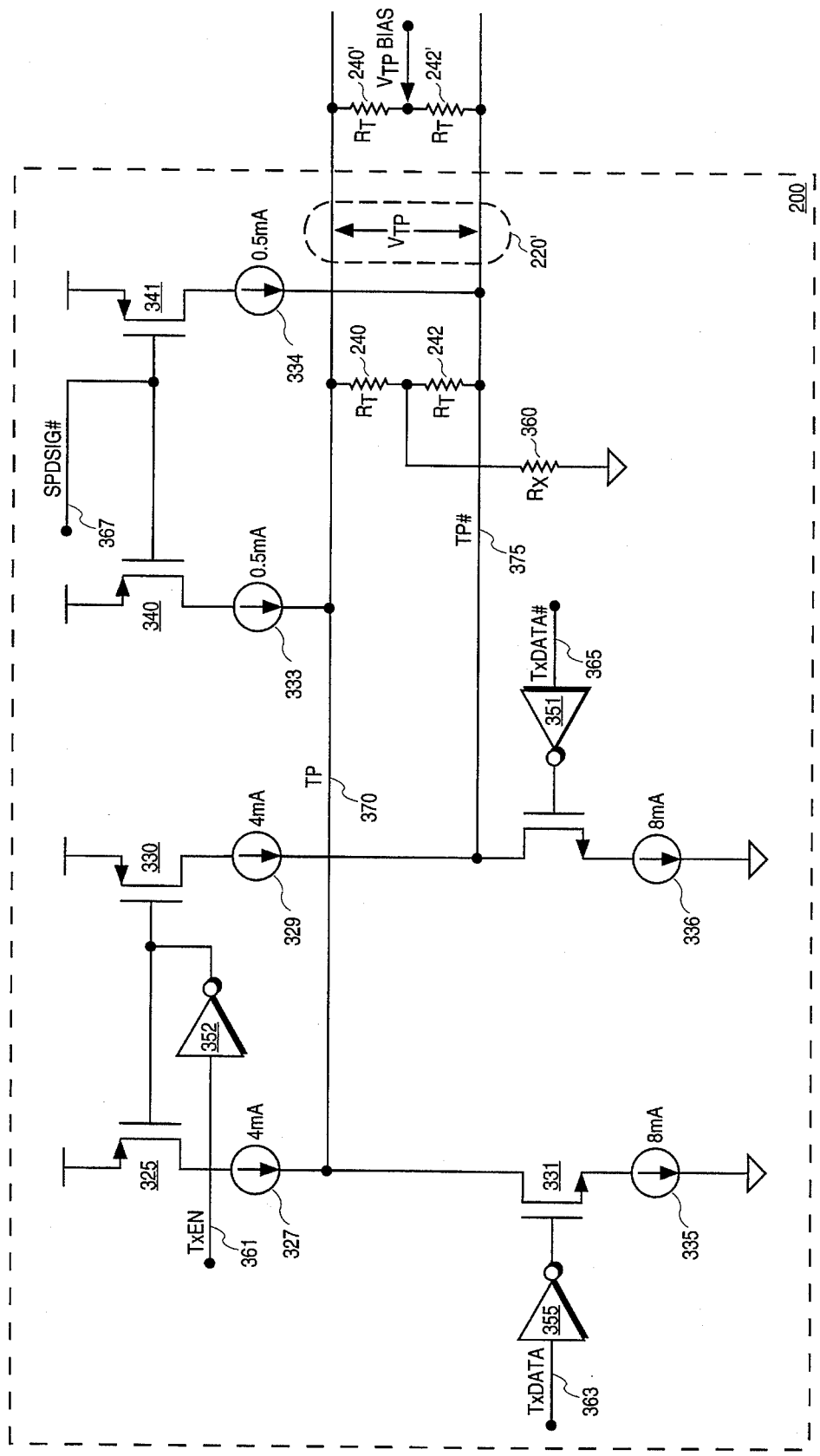
FIG. 4 is a circuit illustration of the single transmitter (driver) circuitry employed by the present invention for common mode and differential signal transmission.

FIG. 4 illustrates a single circuit transmitter 200 of the present invention (as implemented within a port circuitry (b) of device 120x) utilizing current sources to drive signals over cable 220. As shown, the transmitter is coupled to line 370 (TP) and line 375(TP#) which both comprise the twisted pair cable 220. Hereinafter and with respect to the drawings, the designation "#" means low asserted. The transmitter 200 is fabricated using digital CMOS technology and operates from 5.0 v to 3.3 v nominal power supply (e.g., Vcc). The pertinent input signals to transmitter 200 are transmit enable (TxEn), transmit data "1" bit (TxData), transmit data "0" bit (TxData#) and a speed signal indication (SpdSig#). The transmitter 200 outputs voltage signals over the twisted pair cable 220. Generally, the transmitter 200 of the present invention is capable of both differential signal transmission and also common mode signal transmission. Differential signal transmission is used for transmitting digital information and common mode signal transmission is used to convey the speed signal information (which may occur during communication arbitration). As described above, depending on the protocol adopted, the speed signal information may be used for indicating that the transmitter 200 is about to transmit at a high transmission rate, e.g., 200 Megabits per second.

During differential signal transmission, transmitter 200 is capable of sending a low voltage signal (indicative of a 0 data bit) or a high voltage signal (indicative of a 1 data bit) and also capable of transmitting a null voltage signal (Z) which is zero volts and consumes no current. Transmitter 200 is capable of transmitting in a common mode wherein the voltages over line 370 and 375 are both reduced by a predetermined amount, thus indicative of speed signal information. In an alternative embodiment, the speed signal common mode may increase the twisted pair common mode voltage.

Specifically, line 361 of FIG. 4 carries the transmit enable (TxEn) signal which is coupled to control p-type transistor 325 and p-type transistor 330. Both transistors are coupled to Vcc (power) as shown. When line 361 is high, both transistors are on and when line 361 is low, both transistors are off. Transistor 325 is coupled to a 4 mA current source 327 which is coupled to line 370. Line 370 is also coupled to an n-type transistor 331 which is coupled to an 8 mA current source 335 that is coupled to ground. The transmit data line 363 is coupled via an inverter 355 to control transistor 331. When line 363 goes high, transistor 331 is off. Transistor 330 is coupled to Vcc and coupled to a 4 mA current source 329 that is coupled to line 375 which is also coupled to n-type transistor 332. Transistor 332 is coupled to an 8 mA current source 336 which is coupled to ground as shown. Transistor 332 is controlled by inverter 351 which receives an input from line 365 (TxData#). When line 365 goes high, transistor 332 is off.

As shown in FIG. 4, p-type transistor 340 is coupled to Vcc and also coupled to a 0.5 mA current source 333 that is coupled to line 370. P-type transistor 341 is also coupled to Vcc and coupled to a 0.5 mA current source 334 which is coupled to line 375. Line 367 controls transistors 340 and 341 and when the speed signal# line 367 is low, both transistors are on. Terminating resistors Rt 240' and 242' are coupled in series across lines 370 and 375 (from device 120y) and in between the two resistors a bias voltage (VtpBias) of approximately 1.8 volts is applied from the voltage supply 350 of device 120y (see FIG. 4). When not operating in common mode, the bias voltage supply 350 does not supply significant common mode current onto line 370 or 375. It is appreciated that the appropriate transistors of driver 200 receiving inputs are used to electrically couple or decouple the appropriate current source from the cable 220. As such, the current sources are switchable on and off to form the resultant circuit.

In operation, the common mode (e.g., the speed signal mode) is not entered as long as line 367 is maintained high; when high, the different signal mode is utilized. In differential signal transmission mode, the transmitter 200 of the present invention asserts line 361 high (transmit enable) and TxData high over line 363 and TxData# low to transmit a "1." In this state, transistors 325 and 330 of driver 200 are on, transistors 340 and 341 are off and transistor 331 is off but transistor 332 is on. The transmitter 200 of the present invention asserts line 361 high (transmit enable) and TxData# high over line 365 and TxData is low over line 363 to transmit a "0." In this state, transistors 325 and 330 of driver 200 are on, transistors 340 and 341 are off, transistor 331 is on but transistor 332 is off. To transmit a null (e.g., zero) voltage (Z signal), the present invention transmitter 200 asserts line 361 low (transmit enable) and asserts line 363 and line 365 high. Transistors 325 and 330 are off, transistors 340 and 341 are off, transistors 331 and 332 are off. In this mode, no voltage is transmitted over the twisted pair cable 220. Therefore, during transmission of a Z signal no power is utilized by the present invention as no current flows across cable 220.

In order for the present invention transmitter 200 to enter the speed signal mode ("common mode"), line 367 is brought low. In common mode, in order to transmit a 0 or 1 signal, the inputs are asserted similar to the assertions as described above, but line 367 is maintained low and line 361 is low. In operation, the common mode is utilized as long as line 367 is maintained low. In speed signal transmission mode, the transmitter 200 of the present invention asserts line 361 low and TxData high over line 363 and TxData# low to transmit a "1." In this mode transistors 325 and 330 are off, transistors 340 and 341 are on and transistor 331 is off but transistor 332 is on. The transmitter 200 of the present invention asserts line 361 low and TxData# high over line 365 and TxData is low over line 363 to transmit a "0." In this state, transistors 325 and 330 are off, transistors 340 and 341 are on, transistor 331 is on but transistor 332 is off. To transmit a null voltage (Z signal) during common mode, the present invention transmitter asserts line 361 high and asserts line 363 and line 365 low. Transistors 325 and 330 are on, transistors 340 and 341 are on, transistors 331 and 332 are on and the differential voltage is zero. In this mode, no differential voltage is transmitted over the twisted pair cable 220. Table I below illustrates the input and output signals realized by the present invention transmitter 200 for transmitting in differential mode only and in speed signal mode with both common mode and differential output.

TABLE I

| Mode | Input | Diff Output |
|---|---|---|
| Diff Signal | T × En = 1, T × Data = 1, T × Data# = 0 SpdSig# = 0 | 1 |
| Diff Signal | T × En = 1, T × Data = 0, T × Data# = 1 SpdSig# = 0 | 0 |
| Diff Signal | T × En = 0, T × Data = 1, T × Data# = 1 SpdSig# = 0 | Z |
| Commn Mode | T × En = 0, T × Data = 1, T × Data# = 0 SpdSig# = 1 | 1 |
| Commn Mode | T × En = 0, T × Data = 0, T × Data# = 1 SpdSig# = 1 | 0 |
| Commn Mode | T × En = 1, T × Data = 0, T × Data# = 0 SpdSig# = 1 | Z |

The driver (transmitter) 200 outputs negative common mode voltage glitch whenever the driver changes from the Z state to either high or low. Fortunately, the driver transitions possible while the transceiver 105 is trying to detect a common mode speed signal are: (1) from Z to Z; or (2) from 1 to Z so that the voltage glitch cannot be mistaken as a transmitted speed signal.

Figure 5:
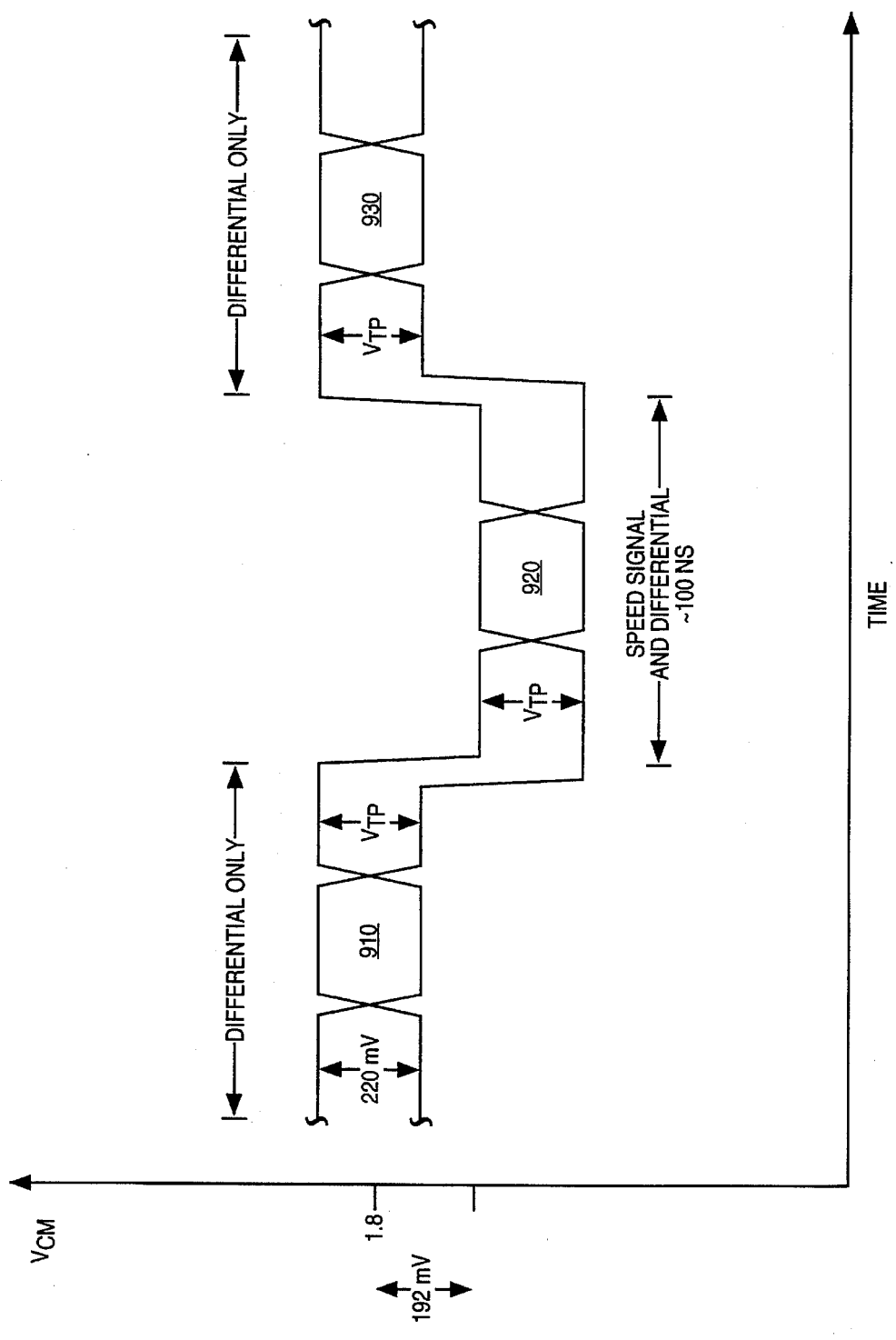
FIG. 5 is a timing diagram illustrating the differential mode transmission and the common mode speed signaling of the present invention.

FIG. 5 is a timing diagram illustrating the effect of the differential and common mode voltage transmissions of the present invention transmitter 200 over the twisted pair cable 220. Voltage is across the vertical and time is across the horizontal. Segment 910 illustrates the differential voltage (Vtp) when in differential transmission mode only. Segment 920 illustrates the wave forms over the twisted pair cable 220 when the present invention enters the common mode to relay the speed signal information. As shown, the common mode voltage over the twisted pair 220 is reduced by a predetermined amount as compared to segment 910. However, in an alternate embodiment, it may be increased. During segment 920, the transmitter is relaying speed signal information and line 367 (FIG. 4) is low. At the start of segment 930, the speed signal is removed and the voltage of the twisted pair cable 220 returns to the levels of segment 910, as shown. A receiver unit 205 may monitor the common mode voltage across cable 220 and will be able to detect the speed signal by the common mode voltage variations between segment 910, segment 920 and segment 930. The speed signal information may be used to set up both transmitter 200 and receiver 210 to process information at a high data transfer rate, e.g., 100 or 200 Megabits per second. It is appreciated that the specific high data transfer rate may be arbitrarily determined as the speed signal of the present invention may be used to indicate a variety of speed settings.

Devices configured to transmit and receive information at 200 Megabits per second can also transmit and receive information at 100 Megabits using the present invention. Therefore a device implemented with the present invention driver circuit may be referred to as a 200/100 Megabit device. Similarly, a device configured to transmit at 400 Megabits may also transmit at 200 or 100 Megabits per second.

Figure 6A:
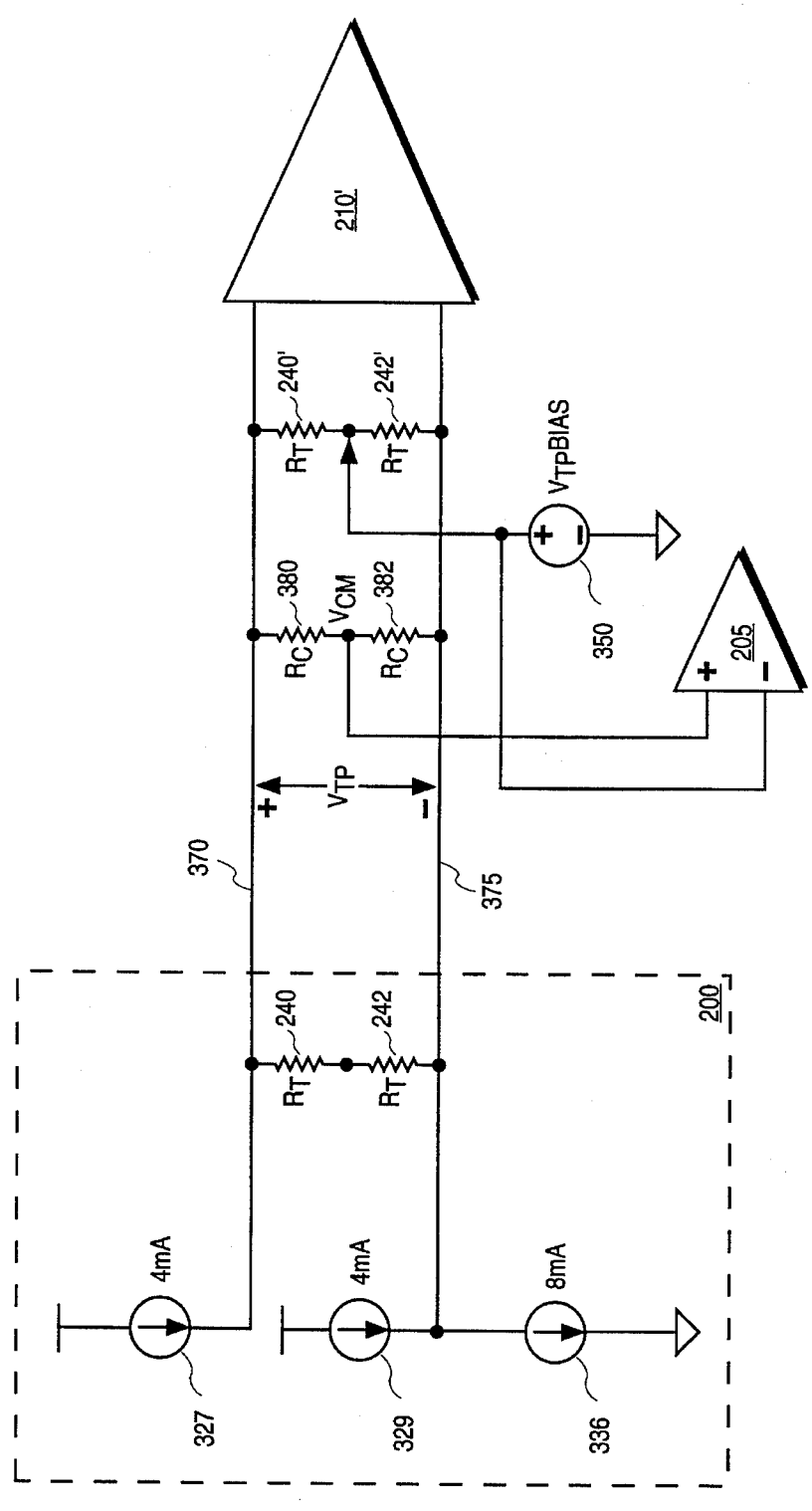
FIG. 6A illustrates a resultant circuit of the present invention for transmission of a "1" in differential mode only.
Figure 6B:
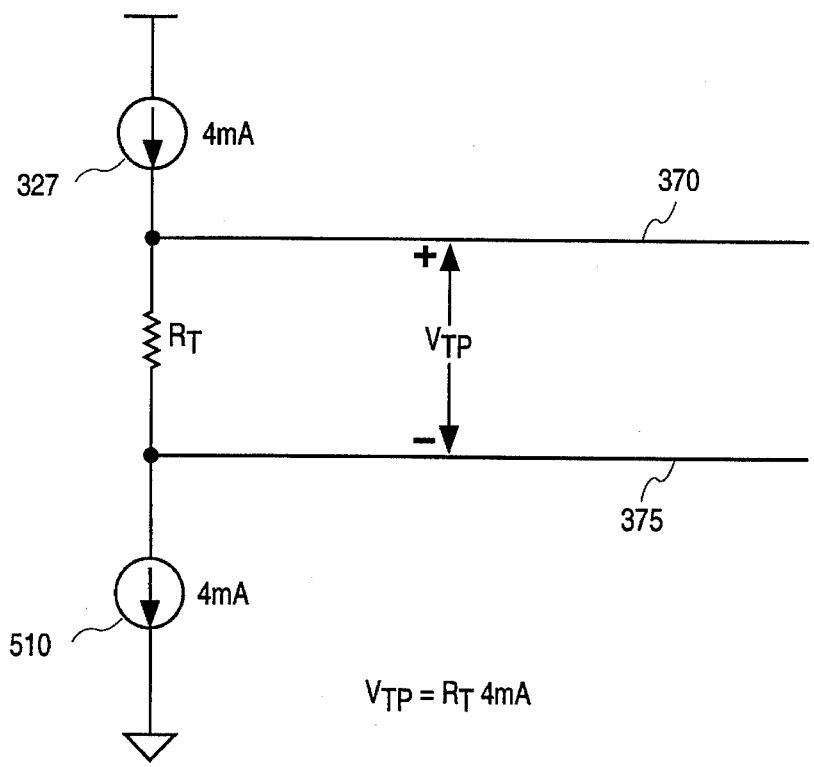
FIG. 6B illustrates a further resultant circuit of the present invention driver circuit for transmission of a "1" in differential mode only.

Refer to FIG. 6A and FIG. 6B. FIG. 6A illustrates a resultant circuit of the driver 200 of FIG. 4 when the speed signal (line 367) of the present invention is high (e.g., not asserted) and when a "1" is to be transmitted from transmitter 200 in differential mode only. Transistors that are off isolate certain portions of the circuit 200. Unit 350 as well as Rc resistors 380 and 382 (of device 120y), as discussed, are provided for measuring the common mode voltage on twisted pair cable 220. Both the transmitter 200 and receiver 210' provide a series connection of terminating resistors 240 and 242 and also 240' and 242'. A bias voltage (VtpBias) is applied to the middle of series resistors 240' and 242' by voltage supply 350 of device 120y. According to the resultant circuit, a 4 mA current source 327 is coupled from Vcc to line 370, a 4 mA current source 329 is coupled from Vcc to line 375 and an 8 mA current source 336 is coupled from line 375 to ground. Electrically, FIG. 6B illustrates a further resultant circuit and as shown, Vtp, the differential voltage across lines 370 and 375, is the current (4 mA) times the resistance (Rt). Assuming, in one embodiment, the Rt value is 55 ohms, the differential voltage Vtp when the present invention transmits a "1" is 220 mV. It is appreciated that in differential mode only, the bias voltage (VtpBias) supply 350 does not supply significant current to the driver circuit of 6A.

Figure 7A:
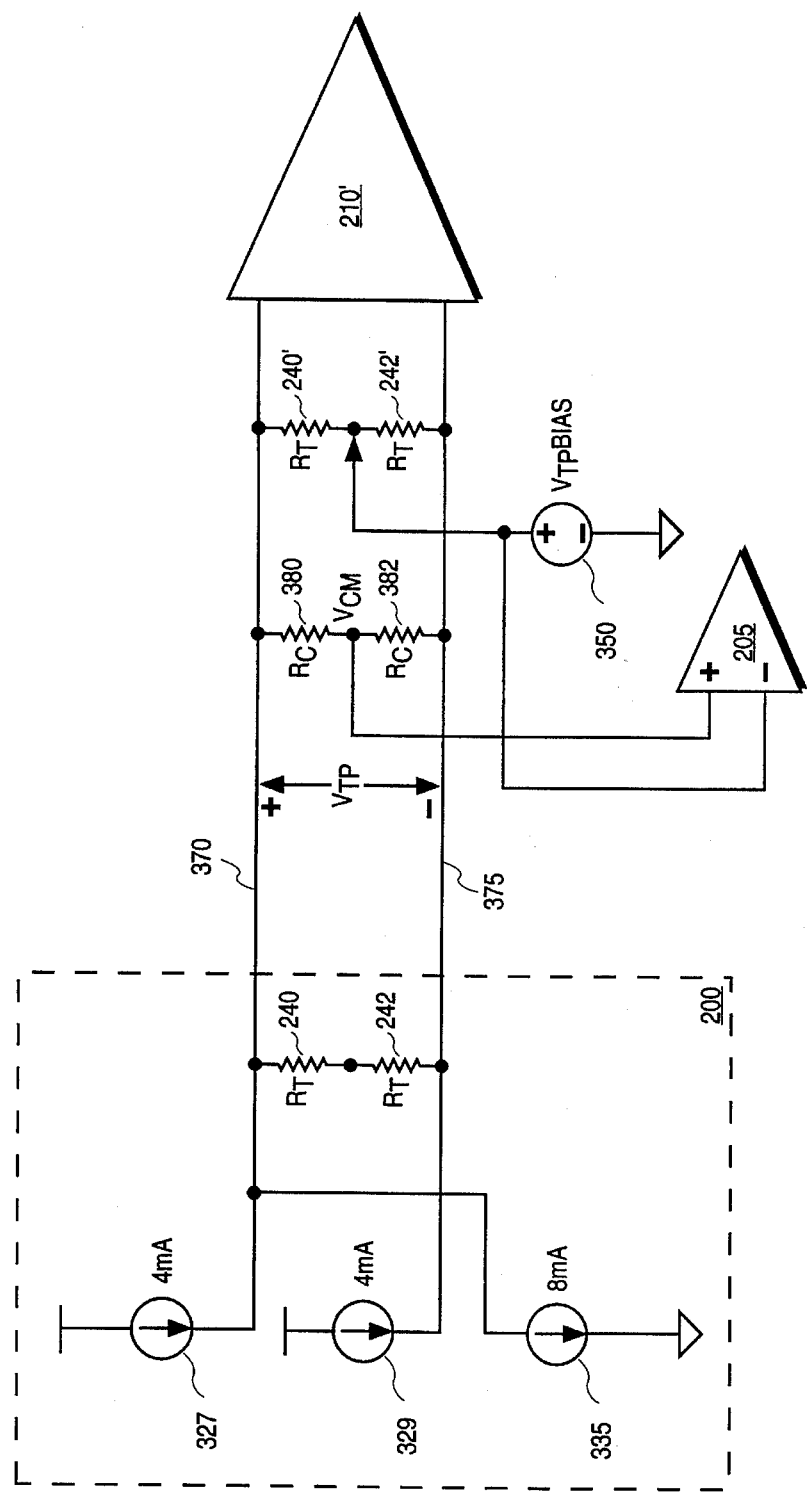
FIG. 7A illustrates a resultant circuit of the present invention driver circuit for transmission of a "0" in differential mode only.
Figure 7B:
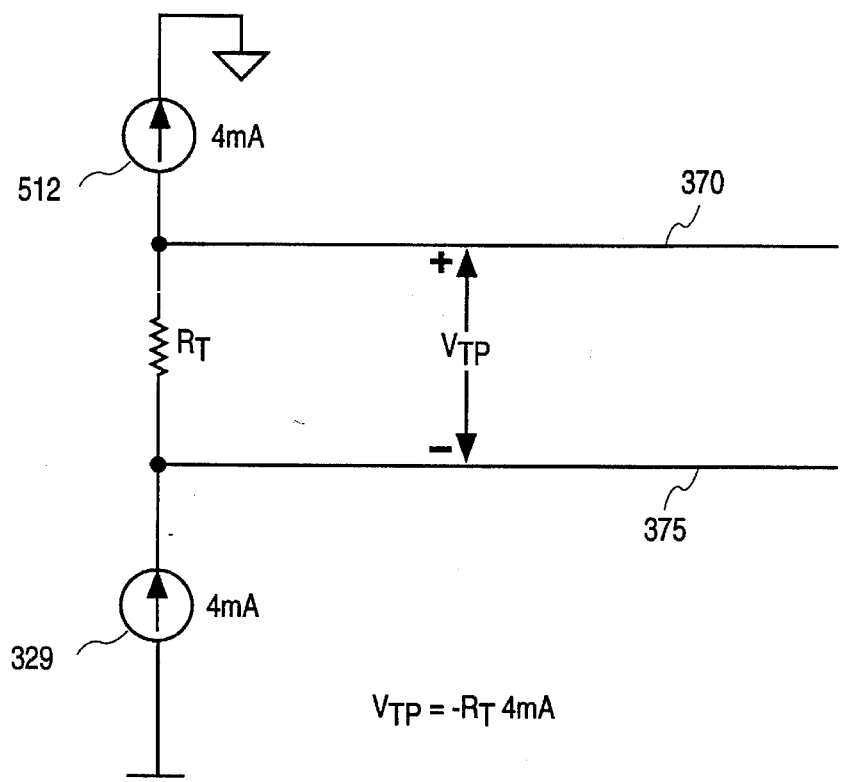
FIG. 7B illustrates a further resultant circuit of the present invention driver circuit for transmission of a "0" in differential mode only.

Refer to FIG. 7A and FIG. 7B. FIG. 7A illustrates a resultant circuit of the driver 200 of FIG. 4 when the speed signal (line 367) of the present invention is high (e.g., not asserted) and when a "0" is to be transmitted from transmitter 200 in differential mode only. Transistors that are off isolate certain portions of the circuit 200. Unit 205 as well as Rc resistors 380 and 382 (of device 120y) are provided for measuring the common mode voltage on twisted pair cable 220. Both the transmitter 200 and receiver 210' provide a series connection of terminating resistors 240 and 242 and also 240' and 242'. A bias voltage (Vtp Bias) is applied to the middle of series resistors 240' and 242' by voltage supply 350 of device 120y. A 4 mA current source 327 is coupled from Vcc to line 370. A 4 mA current source 329 is coupled from Vcc to line 375 and an 8 mA current source 335 is coupled from line 370 to ground. Electrically, FIG. 7B illustrates a further resultant circuit and as shown, Vtp, the differential voltage across lines 370 and 375, is the current (−4 mA) times the resistance (Rt). Assuming, in one embodiment, the Rt value is 55 ohms, the differential voltage Vtp when the present invention transmits a "0" is −220 mV. It is appreciated that in differential mode only, the bias voltage (VtpBias) does not supply significant current to the driver circuit of FIG. 7A.

It is appreciated that during differential signal mode while the speed signal line 367 is not asserted, when transmitting a Z signal, no current flows through cable 220 and no differential voltage is present since no voltage flows through the terminating resistors 240 and 242 of driver 200.

Figure 8:
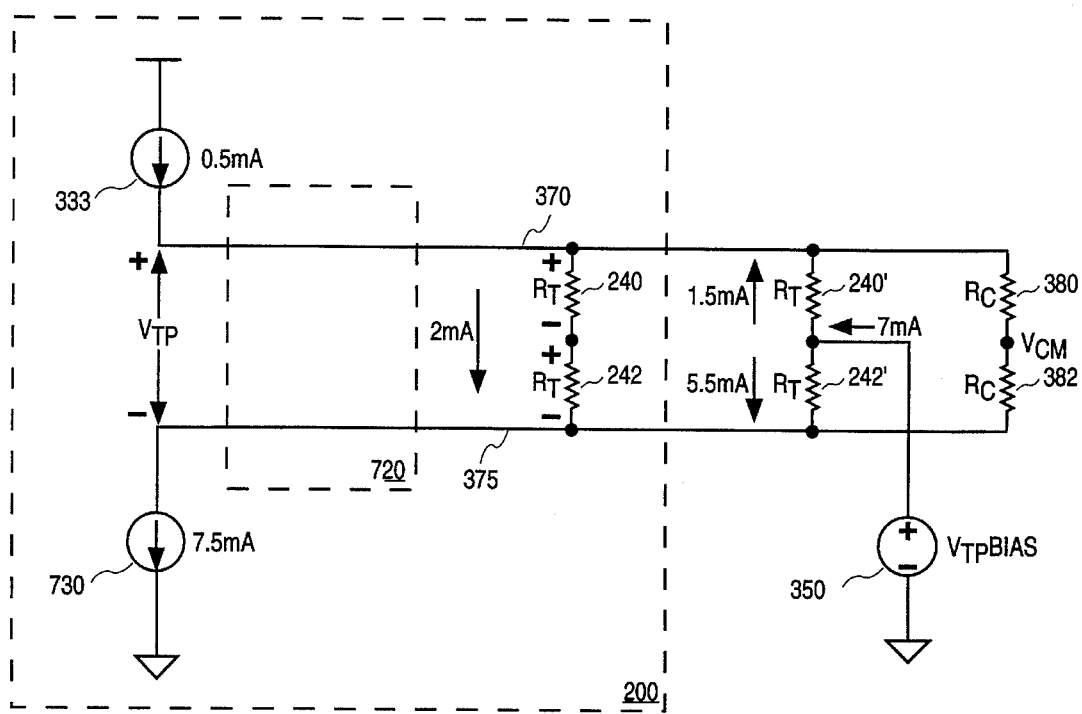
FIG. 8 is an illustration of a resultant circuit of the present invention driver circuit for transmission of a "1" in common mode (speed signal).

FIG. 8 illustrates the resultant circuit of the driver circuit 200 of FIG. 4 when in common mode and a "1" is to be signaled. In common mode, the speed signal# (line 367)is brought low, e.g., asserted. In common mode speed signaling, the bias voltage (VtpBias) supplies current into the circuit as shown in FIG. 8. In this mode, the 0.5 mA current source 333 is coupled from Vcc to line 370. An equivalent current source 730 of 7.5 mA is coupled from line 375 to ground. Solving current equations in the well known manner, the current between each node may be determined. These currents are illustrated in FIG. 8. In this configuration, the bias voltage supply 350 of device 120y supplies 7 mA of current and 2 mA of current flow through the series connection of terminating resistors 240 and 242 of driver 200. Therefore, while transmitting a "1" in common mode, the differential voltage (Vtp) of the present invention driver is 2 mA multiplied by (2 Rt) or 220 mV. However, less current (e.g., 7.5 mA as opposed to 8.0 mA) is sunk to ground in speed signal mode and therefore the common mode voltage is decreased by 192 mV as compared to differential mode only. This is shown in FIG. 5, e.g., between segments 910 and 920.

The common mode voltage (Vcm) may be measured between series resistors 380 and 382 of device 120y. A 10 k resistor (Rc) 380 and a 10 k resistor (Rc) 382 are coupled in series across lines 370 and 375 and the voltage between (Vcm) is measured. The receiver 210' of device 120y may utilize such a circuit, along with comparator 205, to detect the speed signal. It is appreciated that the common mode signal may also be detected and discussed in terms of a common mode current flow over the cable 220 regarding an alternate embodiment of the present invention.

Figure 9:
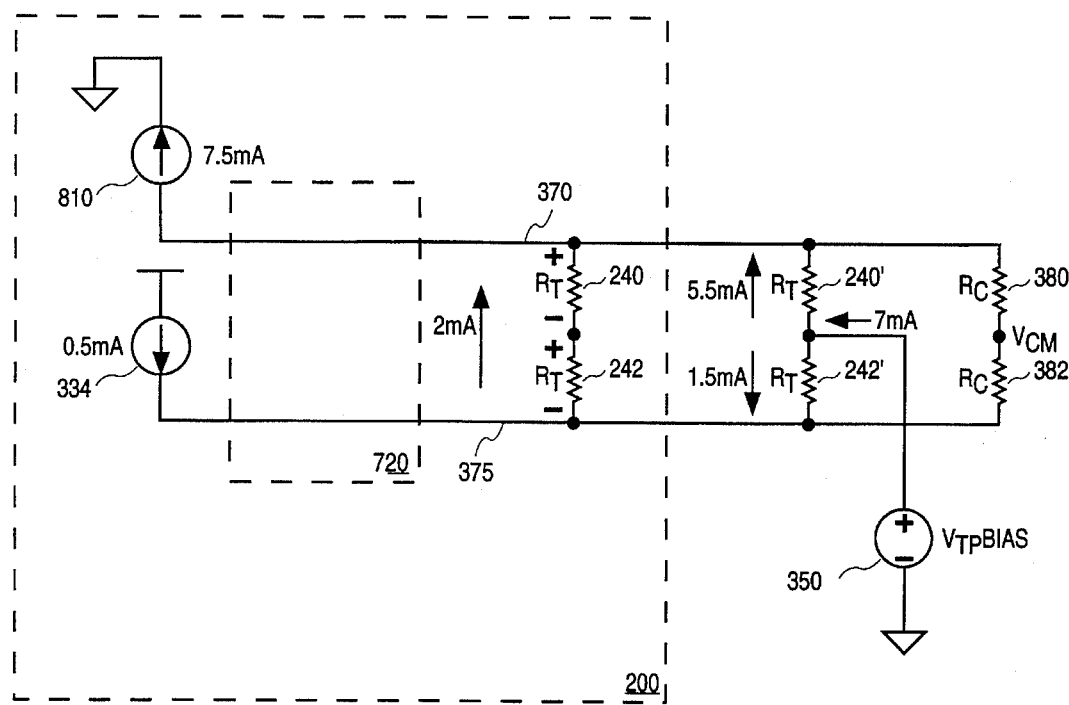
FIG. 9 is an illustration of a resultant circuit of the present invention driver circuit for transmission of a "0" in common mode (speed signal).

FIG. 9 illustrates the resultant circuit of the driver circuit 200 of FIG. 4 when in common mode and a "0" is to be signaled. In common mode, the speed signal# (line 367)is brought low, e.g., asserted. In common mode speed signaling, the bias voltage (VtpBias) supplies current into the circuit as shown in FIG. 9. The 0.5 mA current source 334 is coupled from line 375 to Vcc. An equivalent current source 810 of 7.5 mA is coupled from line 370 to ground. Solving current equations in the well known manner, the current between each node may be determined are illustrated in FIG. 9. In this configuration, the bias voltage supply 350 of device 120y supplies 7 mA of current and 2 mA of current flow through the series connection of terminating resistors 240 and 242 of driver 200 in the direction indicated. Therefore, while transmitting a "0" in mV. However, in speed signaling less current (e.g., 7.5 mA as opposed to 8.0 mA) flows ground and therefore the common mode voltage is decreased by 192 mV and common mode current flows through cable 220.

During speed signaling, to transmit a Z signal, Table I illustrates the inputs utilized by the driver 200 and according to well known circuit equations, the driver 200 of the present invention will not generate a differential voltage across lines 370 and 375 but the common mode voltage will decrease as shown in FIG. 5. The bias voltage supply 350 will supply current in this configuration.

It is appreciated that throughout the discussion herein, the reference ground between the two devices may have a different potential voltage.

As shown, the driver circuit 200 utilizes current sources within a single circuit configuration to both generate differential voltage signals and also generate common mode voltage (or current) variations for speed signaling. This driver 200 is used to drive a twisted pair cable. The driver 200 may be used in a variety of communication protocols to signal communication rate variations between communicating devices of a network. The single circuit driver 200 of the present invention is ideally suited for the IEEE P1394 communication standard.

COMMON MODE EARLY VOLTAGE COMPENSATION SUBCIRCUIT OF THE PRESENT INVENTION

The preferred embodiment of the present invention includes subcircuit for minimizing the amount of improper common mode current flow from driver 200 over twisted cable 220 in the event that the driver 200 of the present invention receives a bias voltage (VtpBias) over the twisted pair cable that deviates from the optimum bias voltage. This may occur when devices having variable ground voltages are coupled together or a bias voltage supply is utilized that varies from an expected or optimum bias voltage level (e.g., a reference bias voltage level). As will be explained in more detail below, when the driver 200 receives an externally supplied bias voltage that deviates (e.g., higher or lower) from the proper operational bias voltage, this arrangement typically produces unwanted common mode current to flow through cable 220 from driver 200. Since the IEEE P1394 communication standard interprets common mode current as speed signal information, the above arrangement may improperly be interpreted by a receiver as a speed signal or may reduce speed signal detection margins. The present invention subcircuit (FIG. 10) will be described below and prevents or minimizes common mode current flow in response to variations in the bias voltage level of a driver circuit. The subcircuit of the present invention effectively increases the common mode early voltage characteristics of the driver circuitry 200 in response to the variations in the received bias voltage (VtpBias) of the driver.

An advantage offered by the present invention subcircuit is that devices of a wider range of bias voltages may be coupled to the communication network without unwanted common mode current flow. Therefore, a communication unit implemented to include the present invention subcircuit may effectively operate with a wider range of ground drops between coupled devices. Also, since the amount of common mode current is reduced, communication devices implemented with the present invention subcircuit require less current capacity of the common mode bias voltage source (VtpBias). With the present invention there is a reduced chance that speed signal information will be improperly interpreted.

As shown in FIG. 3, the driver 200 of circuit (b) receives an external bias voltage from the voltage supply circuit 350 of device 120y. Depending on the ground voltage nodes of device 120x and 120y, the bias voltage received by device 120x may be as much as 0.5 volt higher or lower than the bias voltage generated by 350. Or, a number of different factors may cause the bias voltage received by the circuit (b) of device 120x to be variant from the expected or optimum bias voltage level. For instance, the voltage tolerance of circuit 350 will contribute to this bias voltage variation. When driver 200 receives an improper bias voltage level from the twisted pair cable 220, common mode current flow typically results into cable 220. For instance, as discussed with reference to FIG. 4 and FIG. 6B, in differential mode without speed signaling asserted, there is no appreciable common mode current flow over twisted pair cable 220. As shown in the resultant circuit of FIG. 6B, in this arrangement 4 mA of current flows from current source 327 and through resistor Rt and 4 mA of current flow to ground. Solving current equations illustrates that no appreciable common mode current flows over line 370 and 375.

Refer to FIG. 6A. Assume that driver 200 is supplied with a high externally generated bias voltage and driver 200 is in differential signal mode only and is transmitting a "1." In this configuration, the voltage between resistors 240 and 242 may be higher than the optimum bias voltage level. Because the bias voltage is too high, driver 200 of device 120x will sink common mode current over the twisted pair cable 220 from the common mode voltage source 350 of device 120y. According to the circuitry of FIG. 4, a high common mode voltage on 370 and 375 of the twisted pair cable 220 will cause the current source 327 and 329 of FIG. 6A to decrease in current supply. Likewise, the current source 336 will increase in current supply. The resultant circuit is shown by the components of FIG. 6A, however, in this configuration the current source 327 will supply approximately (4–dp) mA, the current source 329 supplies (4–dp) mA and the current source 336 supplies (8+dn) mA. Therefore, since driver 200 receives an improperly high bias voltage, an amount of (dn+2dp) mA of common mode current is sunk by the driver 200 from cable 220. This may improperly appear as speed signal information to receiver 205 of device 120y.

Alternatively, in the condition wherein the bias voltage (VtpBias) received by driver 200 (of circuit (b) of device 120x) is lower than the optimum bias level, the current through the p-type transistors 327 and 329 typically increases by an amount dp (e.g., becomes 4+dp), the current in n-type transistors 335 and 336 increases by dp (e.g., becomes 4–dp) causing common mode current flow (dn+2dp) to be sourced by the driver 200 into the cable 220.

One method of solving the above problem is to increase the channel length of the n-type and p-type driver transistors that make up the current source drivers (e.g., as shown in FIG. 4). This will give the current sources a larger output impedance and they will become more resistance to current fluctuations when the bias voltage increases or decreased from the optimum voltage. However, this solution is not advantageous because larger channel length transistors are slower than smaller channel length transistors and driver 200 is configured for high speed communication. Therefore, the larger channel length transistors are too slow and too costly in die size or otherwise. The present invention subcircuit, as shown in FIG. 10, solves the above problem without requiring larger channel length transistors.

Figure 10:
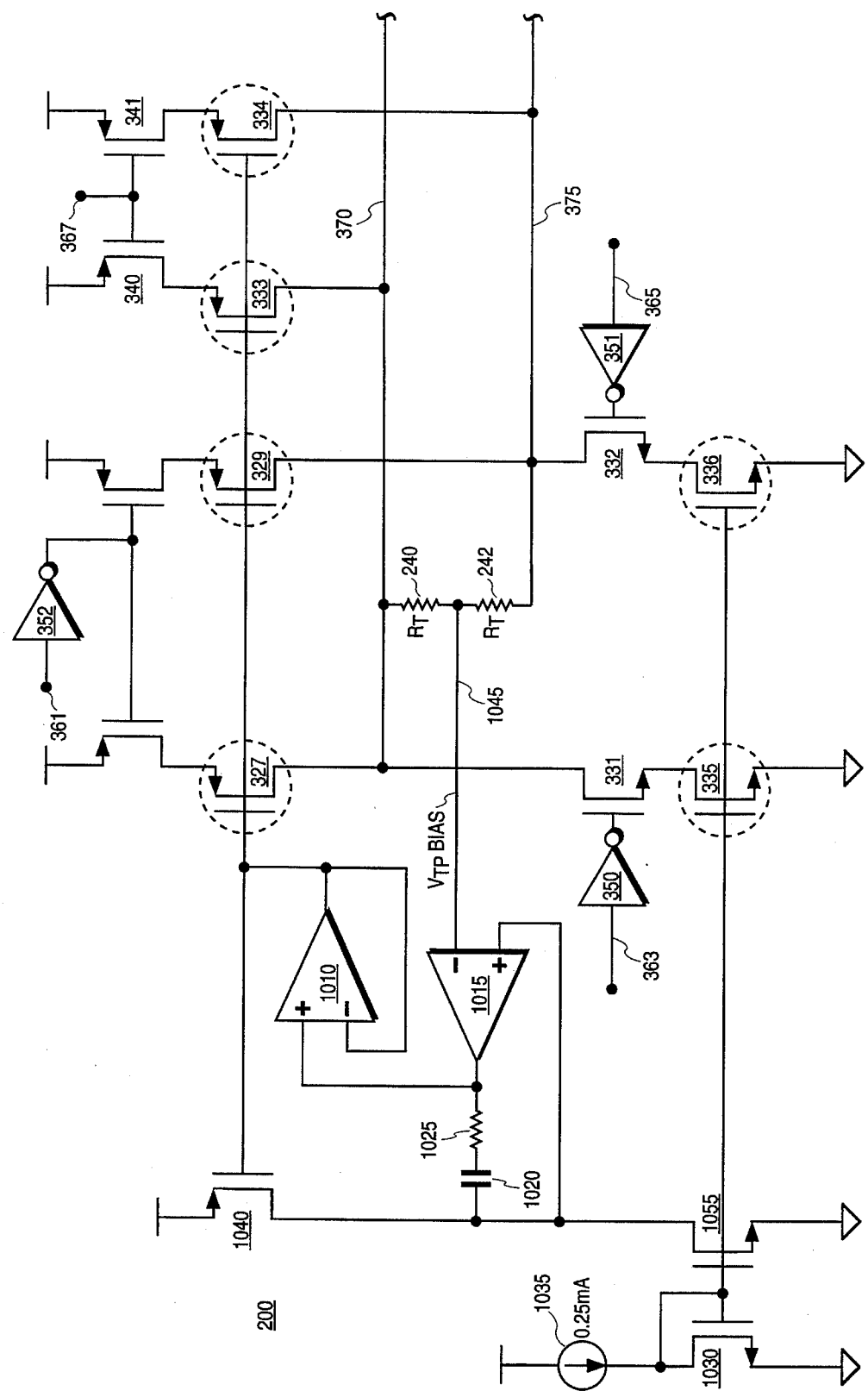
FIG. 10 is an illustration of the common mode early voltage correction (compensation) subcircuit of the preferred embodiment of the present invention as integrated within the driver circuit of the present invention.

The preferred embodiment of the present invention is illustrated in circuit format in FIG. 10. The subcircuit is illustrated coupled with the other components of the driver 200 as discussed previously with reference to FIG. 4. Driver 200 as shown in FIG. 10 is the driver of device 120x of circuit (b) as shown in FIG. 4. The current drivers are illustrated in FIG. 10 in transistor form and comprise, as shown, small channel length p-channel transistors. Transistors 335 and 336 are n-type transistors. The structure of the subcircuit of the present invention is now discussed and comprises amplifiers 1010 and 1015 as well as resistor 1025 and capacitor 1020. Also, p-type transistor 1040 and n-type transistor 1055. A 0.25 mA current source 1035 is coupled to Vcc (power) and coupled to n-type transistor 1030 which is coupled to ground. The gate of transistor 1030 is coupled to the gate of transistor 1055, transistor 335, and transistor 336 and also coupled to current source 1035.

The inverted input of amplifier 1015 is coupled to the node between resistors 240 and 242 at node 1045. Here the bias voltage received by the driver 200 is monitored. The bias voltage is generated by the voltage supply 350 of device 120y (as VtpBias). However, for a variety of reasons, as discussed above, the bias voltage may vary as perceived by the driver circuit 200 of device 120x. The positive input of amplifier 101 5 is a feedback loop and is coupled to one node of capacitor 1020 which is coupled to resistor 1025 which is coupled to the output of amplifier 1015. This is a feedback arrangement. As shown, the node coupled to the positive input of amplifier 1015 will mirror the voltage signal on node 1045 (the common mode voltage). The output of amplifier 1015 is coupled to the positive input of amplifier 1010. The negative input of amplifier 1010 is coupled to the output of amplifier 1010 in a voltage follower feedback arrangement. The output of amplifier 1010 is coupled to the gate of current sources 327, 329, 333, and 334 and also coupled to the gate of transistor 1040. It is appreciated that the gates of transistors 327, 329,333, and 334 are coupled together as shown in FIG. 10. These gates are effected by the signal from the output node of amplifier 1010.

Transistor 1040 is coupled to Vcc and also coupled to one node of capacitor 1020. The gate of transistor 1055 is coupled to the gate of transistor 1030 and also coupled to the gates of transistors 335 and 336 (e.g., the 8 mA n-type current sources). The drain of transistor 1055 is coupled to the positive input node of amplifier 1015 as is the drain of transistor 1040. The capacitor 1020 and resistor 1025 are used for compensation of the feedback loop of the present invention. The twisted pair cable lines 370 and 375 of FIG. 10 coupled with the receiver 210' (not shown in FIG. 10) of another device. The VtpBias circuit 350 of the other device is generating the bias voltage that is sampled or monitored at 1045 by the present invention subcircuit.

In operation, the subcircuit of the present invention provides a feedback mechanism that, in effect, forces the current in transistor drivers (327, 329, 333, and 334) to track the change in current in 335 and 336 as the common input voltage varies and therefore increases the common mode early voltage characteristic of the driver 200 in response to a common mode (bias) voltage that is higher (or lower) than expected. The common mode (bias) voltage is monitored at node 1045.

Note that the n channel transistors 335 and 336 do increase (or decrease) in current as the common mode input voltage received at 1045 goes higher (or lower). However, the increase (or decrease) of the p channel transistors' current caused by the feedback subcircuit of the present invention tracks the n channel transistors' current change and results in no net common mode output current (source or sink). As a result, the driver's common mode output impedance is effectively increased by the feedback subcircuit of the present invention.

It is appreciated that the driver's channel lengths are relatively small. Therefore, although the transistors have an effective increase in common mode output impedance, their relatively small size allows for high speed communication.

For instance, assume driver 200 is in differential mode only and assume the common mode voltage over line 1045 increases, then the node at the positive input of amplifier 1015 will mirror this increase. The increase in the voltage at the positive input node of amplifier 1015 will cause the current through transistor 1040 to increase. This will then cause the current through transistor 327 and 329 to increase. Also, as a result of the voltage increase at the drain of transistor 1055, current through transistor 1055 increases and so does the current through transistors 335 and 336 due to the voltage increase at node 1045. The effective common mode early voltage characteristic of the driving transistors is altered by the subcircuit of the present invention.

Therefore, since the current through the upper transistors (327 and 329) and through the lower transistors (335 and 336) increases proportionately, the overall common mode current remains the same between the transistors and therefore no common mode signal is perceived over the twisted pair (lines 370 and 375). As a result, the driver 200 of the present invention an effective increase in common mode output impedance (due to the effective increase in common mode early voltage) but may be fabricated with relatively small channel lengths and therefore operate at high communication rates. As a result of the present invention subcircuit, no appreciable common mode current flows over the twisted pair cable 220 even if a larger than optimum bias voltage is applied at node 1045.

Further, by decreasing the current flow over cable 220, a reduced current capacity common mode bias voltage source (VtpBias) may be utilized for the external bias voltage supply for driver 200. As a result of the present invention common mode early voltage subcircuit, the driver 200 of the present invention may operate effectively over a wide common mode range. It is appreciated that the subcircuit of the present invention, as shown in FIG. 10, also operates to maintain proper common mode current flow through cable 220 in speed signal mode as well. In this mode, the driver's transistors including transistors 333 and 334 have an increased common mode early voltage characteristic because they are active during speed signaling. Likewise, p-type transistors 333 and 334 may be fabricated of smaller channel length due to the effective increase in common mode output impedance provided by the present invention subcircuit.

Similarly, if the bias voltage at 1045 is lower than expected, then the present invention common mode early voltage correction decreases the current flow through transistor 1040 and the current through p-type transistors 327 and 329 are also decreased to compensate. The current flow through n-type transistors 335 and 336 is decreased so that the net result of the above compensations is that no appreciable common mode current flows over cable 220. Again, the effective early voltage characteristics of the driver 200 are increased to reduce common mode current flow between the driver 200 and cable 220 of the present invention.

The preferred embodiment of the present invention, a circuit for compensating for variations in external bias voltage of a driver circuit such that appreciable common mode current is not supplied in response over a twisted pair cable coupled to the driver circuit, is thus described. While the present invention has been described in particular embodiments, it should be appreciated that the present invention should not be construed as limited by such embodiments, but rather construed according to the below claims.

What is claimed is:

1. A driver circuit comprising:

driving circuitry driving differential signals over a twisted pair cable and driving common mode current signals containing information over said twisted pair cable, said driving circuitry comprising driving transistors and having a bias voltage, said driving transistors coupled to said twisted pair cable; and a subcircuit coupled to said driving circuitry and modifying an effective common mode early voltage characteristic of said driving transistors in response to variations in said bias voltage from a reference voltage level, said subcircuit effectively reducing common mode current flow over said twisted pair cable in response to variations of said bias voltage from said reference voltage level.

2. A driver circuit as described in claim 1 wherein said subcircuit is for increasing an effective output impedance of said driving transistors of said driving circuitry.

3. A driver circuit as described in claim 1 wherein said common mode current signals over said twisted pair cable are for conveying speed signal information.

4. A driver circuit as described in claim 1 wherein said subcircuit comprises two amplifiers coupled in a feedback arrangement.

5. A driver circuit as described in claim 1 wherein said driving transistors of said driving circuitry are current drivers.

6. A driver circuit as described in claim 1 wherein said driving transistors of said driving circuitry are small channel length p-type transistors.

7. A high speed current driver circuit comprising:
(a) a biased driver circuit driving differential and common mode current signals containing information over a twisted pair cable, said driver circuit driving high, low and null signals representative of digital information, said driver circuit comprising:
a first pair of transistors coupled to said twisted pair cable for driving differential signals;
a second pair of transistors coupled to said twisted pair cable for driving common mode signals; and
a third pair of transistors coupled to said twisted pair cable, said third pair of transistors for use in conjunction with said first pair and said second pair of transistors; and
(b) a common mode early voltage compensation circuit coupled to said biased driver circuit, said common mode early voltage compensation circuit monitoring a bias voltage level and minimizing common mode current flow over said twisted pair cable in response to variations of said bias voltage level from a reference bias voltage.

8. A high speed current driver as described in claim 7 wherein said common mode early voltage compensation circuit is for effectively increasing common mode early voltage characteristics of said first pair of transistors in response to said variations of said bias voltage level.

9. A high speed current driver as described in claim 8 wherein said first pair of transistors of said biased driver circuit are small channel length p-type transistors.

10. A high speed current driver as described in claim 8 wherein said common mode current signals are for conveying speed signal information.

11. A high speed current driver as described in claim 8 wherein said common mode early voltage compensation circuit comprises two amplifiers coupled in a feedback arrangement.

12. A driver circuit for communicating information over a twisted pair cable, said driver circuit comprising:
first circuitry for generating differential voltage signals over said twisted pair cable, said differential signals representative of binary data, said first circuitry having a bias voltage;
second circuitry for generating a common mode voltage signal over said twisted pair cable, said second circuitry responsive to a speed signal input, and said common mode voltage signal for indicating a high speed transmission rate; and
a common mode early voltage compensation circuit coupled to said first and second circuitry for monitoring said bias voltage and for minimizing common mode current flow over said twisted pair cable in response to variations of said bias voltage from a reference bias voltage level.

13. A driver circuit as described in claim 12 wherein said second circuitry is also for generating differential voltage signals over said twisted pair cable simultaneously with said common mode voltage signal.

14. A driver circuit as described in claim 12 wherein said common mode early voltage compensation circuit is for effectively increasing common mode early voltage characteristics of said first circuitry in response to said variations of said bias voltage.

15. A driver circuit as described in claim 14 wherein said first circuitry comprises p-type transistors of small channel length.

16. A driver circuit as described in claim 14 wherein said common mode early voltage compensation circuit comprises two amplifiers coupled in a feedback arrangement.

17. A driver circuit as described in claim 12 wherein said first circuitry is responsive to a set of inputs for generating high, low, and null differential voltage signals.

18. A driver circuit as described in claim 17 wherein said first circuitry comprises switchable current sources that are electrically coupled to or decoupled from said twisted pair cable in response to said set of inputs.

19. A driver circuit as described in claim 13 wherein said second circuitry is responsive to a set of inputs for generating said common mode voltage signal and also for generating high, low, and null differential voltage signals.

20. A driver circuit as described in claim 19 wherein said second circuitry comprises switchable current sources that are electrically coupled to or decoupled from said twisted pair cable in response to said set of inputs.

21. A driver circuit as described in claim 12 wherein said first circuitry and said second circuitry are implemented in CMOS technology on a single driver circuit.

22. A communication network comprising:
a plurality of communicating devices comprising a general purpose computer system, a digital graphic display device, a digital graphic input device, and a digital information storage device; and
associated with individual devices of said network, a driver circuit for communicating information over a twisted pair cable, said driver circuit comprising:
driving circuitry driving differential signals over said twisted pair cable and driving common mode current signals containing information over said twisted pair cable, said driving circuitry comprising driving transistors and having a bias voltage, said driving transistors coupled to said twisted pair cable; and
a subcircuit coupled to said driving circuitry and modifying an effective common mode early voltage characteristic of said driving transistors responsive to variations in said bias voltage from a reference voltage level, said subcircuit effectively reducing common mode current flow over said twisted pair cable in response to variations of when said bias voltage from said reference voltage level.

23. A communication network as described in claim 22 wherein said subcircuit is for increasing an effective output impedance of said driving transistors of said driving circuitry.

24. A communication network as described in claim 22 wherein said common mode current signals over said twisted pair cable are for conveying speed signal information.

25. A communication network as described in claim 22 wherein said subcircuit comprises two amplifiers coupled in a feedback arrangement.

26. A communication network as described in claim 22 wherein said driving transistors of said driving circuitry are current drivers.

27. A communication network as described in claim 22 wherein said driving transistors of said driving circuitry are small channel length p-type transistors.

28. In a communication device, a method of communicating information over a twisted pair cable, said method comprising the steps of:

generating differential voltage signals over said twisted pair cable, said differential voltage signals representative of digital information for transmission, said step of generating differential voltage signals performed by a single driver circuit;

generating common mode voltage signal over said twisted pair cable, said common mode voltage signal for signaling communication speed information, said step of generating common mode voltage signal also performed by said single driver circuit;

monitoring a bias voltage of said single driver circuit; and minimizing common mode current flow over said twisted pair cable in response to variations of said bias voltage from a reference bias voltage level.

29. A method of communicating information as described in claim 28 wherein said step of minimizing common mode current flow over said twisted pair cable comprises the step of increasing a common mode early voltage characteristic of said single driver circuit in response to said variations of said bias voltage.

30. A method of communicating information as described in claim 28 wherein said steps of monitoring said bias voltage of said single driver circuit and minimizing common mode current flow over said twisted pair cable are implemented with amplifiers coupled in a feedback arrangement.

31. A method of communicating information as described in claim 28 wherein said step of generating differential voltage signals and said step of generating common mode voltage signal may be performed simultaneously over said twisted pair cable.

32. A method of communicating information as described in claim 28 further comprising the step of receiving a set of digital signal inputs for generating high, low and null differential voltage signals and wherein said step of generating differential voltage signals is responsive to said set of digital signal inputs.

33. A method of communicating information as described in claim 32 wherein said step of generating differential voltage signals utilizes switchable current sources that are electrically coupled to or decoupled from said twisted pair cable in response to said set of digital signal inputs.

34. A method of communicating information as described in claim 31 further comprising the step of receiving a set of digital signal inputs for generating said common mode voltage signal and also for generating high, low, and null differential voltage signals and wherein said step of generating said common mode voltage signal is responsive to said set of digital signal inputs.

35. A method of communicating information as described in claim 34 wherein said step of generating common mode voltage signal utilizes switchable current sources that are electrically coupled to or decoupled from said twisted pair cable in response to said set of digital signal inputs.

* * * * *